United States Patent
Shi et al.

(10) Patent No.: US 8,964,083 B2
(45) Date of Patent: Feb. 24, 2015

(54) CMOS IMAGE SENSOR, TIMING CONTROL METHOD AND EXPOSURE METHOD THEREOF

(75) Inventors: Danwei Shi, Shenzhen (CN); Kun Zhou, Shenzhen (CN); Di Wu, Shenzhen (CN)

(73) Assignee: Shenzhen Taishan Online Technology Co., Ltd., Shenzhen (CN)

( * ) Notice: Subject to any disclaimer, the term of this patent is extended or adjusted under 35 U.S.C. 154(b) by 109 days.

(21) Appl. No.: 13/701,741

(22) PCT Filed: Jun. 4, 2010

(86) PCT No.: PCT/CN2010/073543
§ 371 (c)(1),
(2), (4) Date: Dec. 3, 2012

(87) PCT Pub. No.: WO2011/150574
PCT Pub. Date: Dec. 8, 2011

(65) Prior Publication Data
US 2013/0076952 A1    Mar. 28, 2013

(51) Int. Cl.
H04N 3/14 (2006.01)
H04N 5/335 (2011.01)
H04N 5/341 (2011.01)
H04N 5/235 (2006.01)
H04N 5/353 (2011.01)
H01L 27/146 (2006.01)

(52) U.S. Cl.
CPC ............. *H04N 5/341* (2013.01); *H04N 5/2354* (2013.01); *H04N 5/353* (2013.01); *H01L 27/14612* (2013.01); *H04N 5/2353* (2013.01)
USPC ........... 348/308; 348/296; 348/362; 348/371; 250/208.1; 257/292

(58) Field of Classification Search
USPC .................. 348/308, 296, 362, 371; 257/292; 250/208.1
See application file for complete search history.

(56) References Cited

U.S. PATENT DOCUMENTS

| | | | |
|---|---|---|---|
| 2003/0007088 A1 | 1/2003 | Rantanen et al. | |
| 2003/0122946 A1 | 7/2003 | Nishino et al. | |
| 2006/0044437 A1* | 3/2006 | Shah | 348/308 |
| 2010/0080549 A1 | 4/2010 | Tamura | |

FOREIGN PATENT DOCUMENTS

| | | | | |
|---|---|---|---|---|
| CN | 201440274 | * | 4/2010 | ............... G06K 9/00 |
| JP | 2009 100381 | | 5/2009 | |
| WO | 2008/152647 | | 12/2008 | |

* cited by examiner

*Primary Examiner* — Paul Berardesca
(74) *Attorney, Agent, or Firm* — Fay Kaplun & Marcin, LLP

(57) ABSTRACT

The invention discloses a CMOS image sensor, a timing control method and an exposure method thereof. The image sensor includes a pixel array composed of multiple pixel rows and a control chip controlling the array. The control chip controls each pixel row to expose in the exposure time during one exposure period of the pixel row, and then wait predetermined time after the exposure time to output data. In the invention, the exposure time of the image sensor is separated from the time of outputting data. Therefore, the working mode of the image sensor can be controlled more flexibly. By the manner of controlling the pixel rows in the sub-array of the image sensor to expose synchronously, the flash time of the light source is the same as the exposure time of each single sub-array, thereby improving the utilization efficiency of the source energy and ensuring real-time image sampling.

6 Claims, 10 Drawing Sheets

CMOS IMAGE SENSOR, TIMING CONTROL METHOD AND EXPOSURE METHOD THEREOF

FIELD OF THE INVENTION

The present invention relates to the field of image sensors, and particularly to a CMOS image sensor, a timing control method and an exposure method thereof, which may be applied in a real-time target detection system.

BACKGROUND OF THE INVENTION

It is a commonly used technique to detect a target by using active light source illumination. FIG. 1 shows a schematic diagram of the process of the existing target detection method. As shown in FIG. 1, several main modules including a light source, an image sensor, a synchronization mechanism and an image processor are generally involved. Features of a target object, such as its position, shape, speed, color, and texture, may be detected in real time by such modules in an operation principle as follows: the light source emits light to illuminate the target object; and the image sensor obtains the image of the entire scene including the target objet and background objects behind the target object, under the control of the synchronization mechanism. The target object may be an ordinary object having a diffuse surface, or a prefabricated special object, that has a surface producing a directional reflection of light so that the light emitted from the light source may be reflected to the image sensor. Since the target object is closer to the light source than the background, or it has the special reflective surface, the brightness of the target object is much higher than that of the background in the image. The image processor receives and divides the image, and a portion of the image with brightness higher than a certain threshold is regarded as the target object, and a portion of the image with brightness lower than the threshold is regarded as the background. As a result, subsequent operations, such as extracting position information, are performed according to the division of the target area.

The currently available detection method as above has the disadvantage that the extraction of the target is susceptible to interference by an ambient light. If the irradiation of the ambient light causes the brightness of a certain region in the background to be higher than that of the target object, the above method will be ineffective.

In the prior art, the general solution for overcoming the interference of the ambient light is to modulate the light source to a specific wavelength $\lambda$ (which is generally out of the range of visible wavelengths in order not to affect observation by human eyes), increase the output power, and arrange a band pass filter corresponding to the wavelength $\lambda$ between the image sensor and the target object, so that only the light of the wavelength $\lambda$ is allowed to pass. This method can suppress the effects of the ambient light to some extent, and improve the contrast between the target object and the background. However, since the ambient light (such as the sunlight and the light of an incandescent lamp) generally contains full wavelengths, and its light intensity at the wavelength $\lambda$ may also be much larger than that of the light emitted from the light source, the method based on the selected specific wavelength may also be failed.

At present, a new method has been proposed to solve above problems. The method uses an ordinary Complementary Metal Oxide Semiconductor (CMOS) image sensor, and obtains continuously two frames of images $I_1$ and $I_2$ from the same scene (assuming that the positions of the target object and the background object are substantially not changed throughout the entire process), here, the image $I_1$ is obtained with the light from the light source, and the image $I_2$ is obtained without the light from the light source. Since the target object is closer to the light source or has a special reflective surface, the brightness of the target object in image $I_1$ is much higher than that in the image $I_2$; on the contrary, since the background object is farther from the light source and has no special reflective surface, the brightness of the background object in the image $I_1$ is not significantly different from that in the image $I_2$. The images $I_1$ and $I_2$ are received by the image processor and subjected to a subtracting operation, resulting in an image I in which the brightness of the target object is much larger than that of the background object. The image I is divided, and a portion of the image I with brightness higher than a certain threshold is regarded as the target object, and a portion of the image I with brightness lower than the threshold is regarded as the background. As a result, subsequent operations, such as extracting positional information, are performed according to the division of the target area.

Such a new method solves the problem of the ambient light radiation, but is disadvantageous in the real-time performance of the entire system and the utilization efficiency of the light source energy. This is related to the operating mode of the CMOS image sensor.

Reference is now made to FIG. 2, which shows a diagram of the operating mode of the existing CMOS image sensor. For most CMOS image sensors, different exposure times are provided for each pixel row. The abscissa in FIG. 2 represents a time axis. As shown in FIG. 2, after a while from starting the exposure of the first pixel row L1, the exposure of the second pixel row L2 starts, and likewise, the exposures of the following pixel rows are started sequentially. The ends of the exposures of the pixel rows are also sequential.

In such an exposure manner, in order that various pixel rows receive the same amount of light emitted from the light source, only two flash time solutions of the light source, namely solutions denoted by Flash 1 and Flash 2 as shown in FIG. 2, can be selected. In the solution Flash 1, the flash is started at the time when the exposure of the last pixel row starts and finished at the time when the exposure of the first pixel row ends. In the solution Flash 2, the flash is started at the time when the exposure of the first pixel row starts and finished at the time when the exposure of the last pixel row ends. Both the two flash solutions have not reached the optimization of time and efficiency. In the solution Flash 1, the flash time of the light source is less than the exposure time of the CMOS image sensor, thus the exposure time is not fully utilized to increase the brightness of the target object. In the solution Flash 2, the flash time of the light source is more than the exposure time of the CMOS image sensor, which causes an insufficient use of the light source energy.

In addition, if the exposure time is increased, the proportion of the interval between the flash time and the exposure time to the total exposure time is gradually reduced. To the upmost degree, the flash time is approximately equal to the exposure time, which is however not advisable, because this solution is used in the real-time target detection system in which the target moves at a certain speed, and the theory of the above method is based on the assumption that the position of the target is almost not changed in the two frames of continuously photographed images. Increasing the exposure time would make this assumption invalid, thus this solution is ineffective.

Therefore, the above problem can be solved if it is ensured that all the pixel rows are synchronously exposed. Reference is now made to FIG. 3, which is a diagram of the operating mode of the CMOS image sensor in the case that all the pixel rows are synchronously exposed. If the flash time is configured to be synchronous with the exposure time, each pixel row may receive the same amount of light emitted from the light source.

However, it is difficult for the current CMOS image sensors to achieve the exposure synchronization among all the pixel rows. The description below is made in detail in conjunction with the circuitry of a pixel unit in the CMOS sensor. Reference is now made to FIG. 4, which is a diagram of the circuitry of the pixel unit of the existing CMOS sensor. The CMOS sensor is an array constituted by a number of such pixel units. As shown in FIG. 4, the pixel unit includes a photocell B, a reset transistor R, a charge overflow transistor T, a source follower FD and a row strobe transistor X. Furthermore, pixel units in each pixel column are connected commonly to a pair of signal outputting transistors, i.e., a first signal outputting transistor SH1 and a second signal outputting transistor SH2. The reset transistor R, the charge overflow transistor T and the photocell B are successively connected in series between an active power and the ground. One end of the source follower FD is connected to the active power, the other end of the source follower FD is connected to the row strobe transistor X, and the gate of the source follower FD is connected to a node between the reset transistor R and the charge overflow transistor T. The other end of the charge overflow transistor T is respectively connected to an end of the first signal outputting transistor SH1 and an end of the second signal outputting transistor SH2 of the pixel column containing the pixel unit.

Reference is now made to FIG. 5, which is a control timing diagram of the pixel unit in the existing CMOS image sensor. As shown in FIG. 5, before the starting of the exposure of pixels in each pixel row, the reset transistor R and the charge overflow transistor T are turned on, and charges in the photocell B and the source followers FD are emptied. After that, the reset transistor R and the charge overflow transistor T are turned off and the exposure starts. The photocell B starts to accumulate charges. Before the exposure time T1 ends, the row strobe transistor X and the first signal outputting transistor SH1 are turned on to sample the reference level of the source follower FD, and then turned off immediately. At the end of the exposure, the charge overflow transistor T is turned on to transfer the charges in the photocell B to the source follower FD, and then the charge overflow transistor T is turned off immediately. The row strobe transistor X and the second signal outputting transistor SH2 are turned on to sample the signal level of the source follower FD. A digital signal is obtained from the comparison between the second signal outputting transistor SH2 and the first signal outputting transistor SH1. It is noted that this is just the exposure control timing of the circuit contained in a certain pixel unit of the CMOS image sensor. In the entire CMOS image sensor, since the CMOS image sensor needs to output data in series, the exposure control timing of pixel units in the same pixel row is synchronous, while the exposure control timing of pixel units in different rows is successively executed in a time order, so that the time for outputting data by each pixel row is not conflicted with another pixel row.

It can be known in conjunction with FIG. 2 to FIG. 5 that, before the end of the exposure time, the row strobe transistor X initiates the sampling of the level, that is, starts to output the data of the pixel row. Thus, in the prior art, data must be immediately output after the exposure in this timing control method. Since the CMOS image sensor is required to output the data in series, only if the exposures of the various pixel rows is started sequentially, the data can be outputted sequentially when the exposure of each pixel row is finished. When the exposure time of all pixel rows is synchronized, the time for outputting data by all the pixel rows is also synchronized, which will inevitably cause that the image data cannot be normally outputted.

SUMMARY OF THE INVENTION

The technical problem to be solved by the present invention is that: in view of the drawback that each pixel row of the existing CMOS image sensor must immediately output data after its exposure and thus the exposure for each pixel row cannot be synchronized, there is provided a CMOS image sensor and a timing control method thereof in which each pixel row may output the data after waiting for a predetermined time after the exposure, so that any two pixel rows of the CMOS image sensor can be exposed synchronously.

Another technical problem to be solved by the present invention is that: in view of the drawback in the existing target detection system that the different pixel rows of the image sensor can only be sequentially exposed, which causes a low utilization efficiency of the light source energy and a poor real-time performance for image acquisition. With the above CMOS image sensor in which each pixel row may wait for the predetermined time and then output the data, there are provided two exposure methods of the CMOS image sensor, so that the different pixel rows can be synchronously exposed and the target image can be effectively photographed for the target detection.

Therefore, the technical solution adopted by the present invention includes a CMOS image sensor, which includes: a pixel array composed of a plurality of pixel rows, and a control chip for controlling the pixel array; wherein, each of the pixel row is exposed within an exposure time under the control of the control chip during one exposure period of the pixel row, and then the pixel row outputs data after waiting for a predetermined waiting time from the exposure time under the control of the control chip.

In the CMOS image sensor according to the present invention, each of the plurality of pixel rows includes the same number of pixel units, each of which includes a photocell, a reset transistor, a charge overflow gate transistor, a row strobe transistor and a source follower, with each pixel unit being connected to a first signal outputting transistor and a second signal outputting transistor of a pixel column containing the pixel unit to output the data; and the control chip sends out, during one exposure period of each pixel row, the following control signals to respectively control the corresponding elements of each pixel unit in the pixel row:

S1: at the beginning of the exposure time, high-level pulses are sent out to turn on the reset transistor and the charge overflow gate transistor, respectively;

S2: at the end of the exposure time, a high-level pulse is sent out to turn on the charge overflow gate transistor;

at the end of the predetermined waiting time after the end of the exposure time, high-level pulses are respectively sent out to turn on the row strobe transistor and the first signal outputting transistor of the pixel column containing the pixel unit, to sample a signal level;

S4: a high-level pulse is sent out to turn on the reset transistor; and

S5: high-level pulses are respectively sent out to turn on the row strobe transistor and the second signal outputting transistor of the pixel column containing the pixel unit, to sample a reference level.

In the CMOS image sensor according to the present invention, the control chip further controls the exposure times of at least two pixel rows in the pixel array to be synchronized, the control chip then controls the at least two pixel rows to output the data after respectively waiting for different predetermined waiting times after the completion of the exposure, and the difference between the predetermined waiting times of the at least two pixel rows is not less than the time required for outputting the data by a single pixel row.

In the CMOS image sensor according to the present invention, the control chip further controls the exposure times of all pixel rows in the pixel array to be synchronized, the control chip then controls all the pixel rows to output the data after respectively waiting for different predetermined waiting times after the completion of the exposure, and the predetermined waiting times of all the pixel rows in the pixel array are incremental sequentially, and the incremental size is not less than the time required for outputting the data by a single pixel row.

The present invention also provides a timing control method of a CMOS image sensor including: a pixel array composed of a plurality of pixel rows and a control chip for controlling the pixel array, characterized in that the timing control method comprises, during one exposure period of each pixel row:

a step of exposure, in which the pixel row is exposed within an exposure time under the control of the control chip; and a step of data output, in which the pixel row outputs data after waiting for a predetermined waiting time from the exposure time under the control of the control chip.

The present invention also provides an exposure method of a CMOS image sensor, for obtaining a target image by photographing in a first light source state and a second light source state, respectively, and outputting the target images to a first frame buffer and a second frame buffer to detect the target, where the CMOS image sensor may be the above described CMOS image sensor, and the exposure method includes the following steps of:

A0: dividing the CMOS image sensor into a plurality of sub-arrays, each of which is composed of the same number of pixel rows;

A1: selecting the first sub-array as the current sub-array for exposing;

A2: controlling each pixel row in the current sub-array for exposing to be synchronously exposed and to output data, in the first light source state and the second light source state, respectively;

A3: determining whether the current sub-array for exposing is the last sub-array, and if so, the method is finished; otherwise, the method goes to step A4; and A4: selecting a sub-array next to the current sub-array for exposing as the current sub-array for exposing, and step A2 is conducted.

The present invention also provides another exposure method of a CMOS image sensor, for obtaining the target image by photographing in a first light source state and a second light source state, respectively, and outputting the target images to a first frame buffer and a second frame buffer to detect the target, where the CMOS image sensor may be the above described CMOS image sensor, and the exposure method includes the following steps of:

B0: dividing the CMOS image sensor into a plurality of sub-arrays, each of which is composed of the same number of pixel rows;

B1: selecting the first sub-array as the current sub-array for exposing;

B2: in the first light source state, controlling each pixel row in the current sub-array for exposing to undergo the first synchronous exposure, then outputting data of a lower half of pixel rows in the current sub-array for exposing to a first frame buffer, and then outputting data of an upper half of pixel rows in the current sub-array for exposing to the first frame buffer;

B3: when the data outputs by the lower half of pixel rows in the current sub-array for exposing are completed, determining whether the current sub-array for exposing is the last sub-array, and if so, the method is finished; otherwise, the position of the current sub-array for exposing is moved down by a half sub-array;

B4: in the second light source state, controlling each pixel row in the current sub-array for exposing to undergo the second synchronous exposure, then outputting data of the lower half of pixel rows in the current sub-array for exposing to a second frame buffer, and then outputting the data of the upper half of pixel rows in the current sub-array for exposing to the second frame buffer; and B5: when the data outputs by the lower half of pixel rows in the current sub-array for exposing are completed, moving down the position of the current sub-array for exposing by a half sub-array, and step B2 is conducted.

The present invention also provides another exposure method of a CMOS image sensor for obtaining the target image by photographing in the first light source state and the second light source state, respectively, and outputting the target images to a first frame buffer and a second frame buffer to detect the target, where the CMOS image sensor may be the above described CMOS image sensor, and the exposure method includes the following steps of:

B'0: dividing the CMOS image sensor into a plurality of sub-arrays, each of which is composed of the same number of pixel rows;

B'1: selecting the last sub-array as the current sub-array for exposing;

B'2: in the first light source state, controlling each pixel row in the current sub-array for exposing to undergo the first synchronous exposure, and then outputting data of an upper half of pixel rows in the current sub-array for exposing to a first frame buffer, and then outputting data of a lower half of pixel rows in the current sub-array for exposing to the first frame buffer;

B'3: when the data outputs by the upper half of pixel rows in the current sub-array for exposing are completed, determining whether the current sub-array for exposing is the first sub-array, and if so, then the method is finished; otherwise, the position of the current sub-array for exposing is moved up by a half sub-array;

B'4: in the second light source state, controlling each pixel row in the current sub-array for exposing to undergo the second synchronous exposure, and then outputting the data of the upper half of pixel rows in the current sub-array for exposing to a second frame buffer, and then outputting the data of the lower half of pixel rows in the current sub-array for exposing to the second frame buffer; and B'5: when the data outputs by the upper half of pixel rows in the current sub-array for exposing are completed, moving upward the position of the current sub-array for exposing by a half sub-array, and step B'2 is conducted.

The implementing of the CMOS image sensor and its timing control method of the invention can bring about the following advantages. Because each pixel row is exposed under the control of the control chip during one exposure period of the pixel row, and then the pixel row output data after waiting for the predetermined waiting time from the exposure time under the control of the control chip, the exposure time of the CMOS image sensor is separated from the time for outputting the data, and hence the operating mode of each pixel row in the CMOS image sensor can be controlled more flexibly, to facilitate various exposure manners of the CMOS image sensor, for example, an exposure manner in which the exposure times of at least two pixel rows are controlled to be synchronized or the exposure times of all the pixel rows are controlled to be synchronized.

Furthermore, the exposure method of the CMOS image sensor implemented with the CMOS image sensor of the invention is advantageous in that: by dividing the CMOS image sensor into a plurality of sub-arrays and controlling all pixel rows in each sub-array to be synchronously exposed in the exposure method of the invention, the flash time of the light source can be equal to the exposure time of the single sub-array, thereby improving the utilization efficiency of the light source energy, and reducing the interval between the exposure time of the same sub-array in the first and second light source states, to effectively obtain the target images by photographing, in order for detecting the target.

BRIEF DESCRIPTION OF THE DRAWINGS

The present invention will be further described below in conjunction with embodiments and drawings, wherein.

DETAILED DESCRIPTION OF PREFERRED EMBODIMENTS

In order for clearly understanding of objects, technical solutions and advantages of the present invention, the present invention will be further described in detail below in conjunction with the accompanying drawings and embodiments.

The present invention provides a CMOS image sensor, which includes a pixel array and a control chip. The pixel array is constituted by a plurality of pixel rows, and the control chip is used to control the data output and the exposure of the pixel rows.

The present invention is characterized in that the control chip controls, during one exposure period of each pixel row, the pixel row to be exposed within an exposure time T1, and then controls the pixel row to output the data after waiting for a predetermined waiting time T2 from the exposure time T1. The predetermined waiting time T2 may be greater than or equal to 0.

Figure 1:
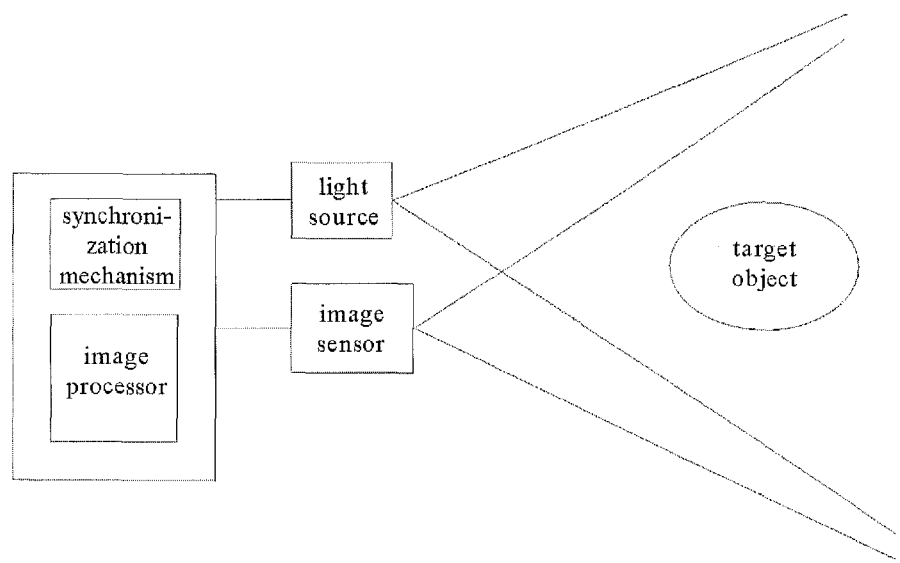
FIG. 1 is a schematic diagram of the process of the existing target detection method.
Figure 2:
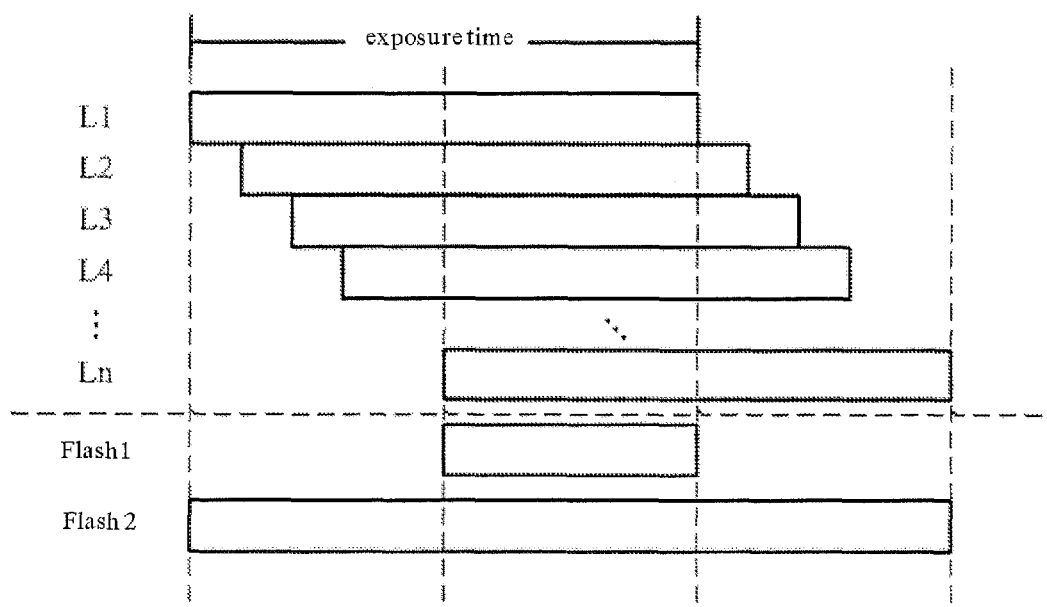
FIG. 2 is a diagram of the operating mode of the existing CMOS image sensor.
Figure 3:
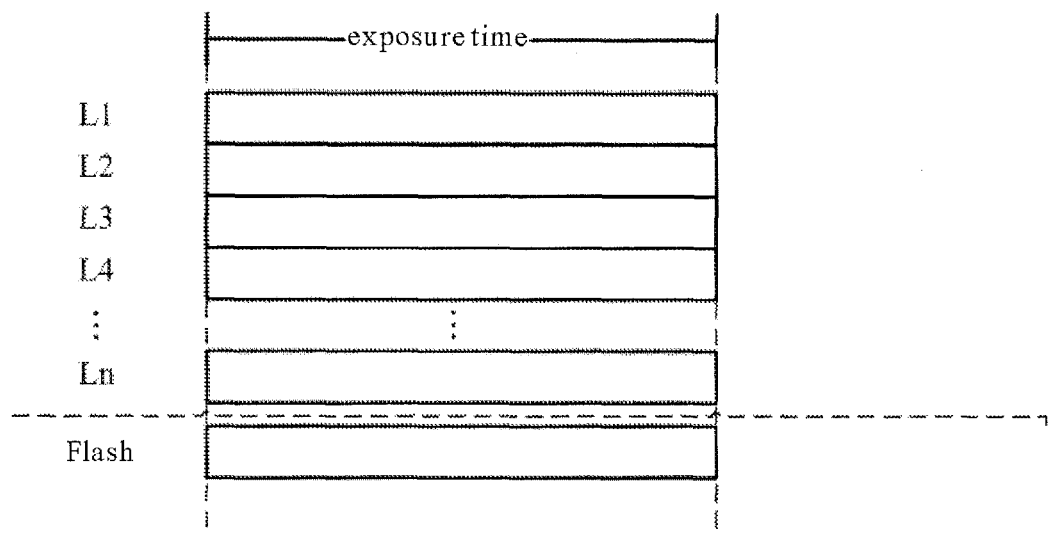
FIG. 3 is a diagram of the operating mode of the CMOS image sensor in the case that all pixel rows are synchronously exposed.
Figure 4:
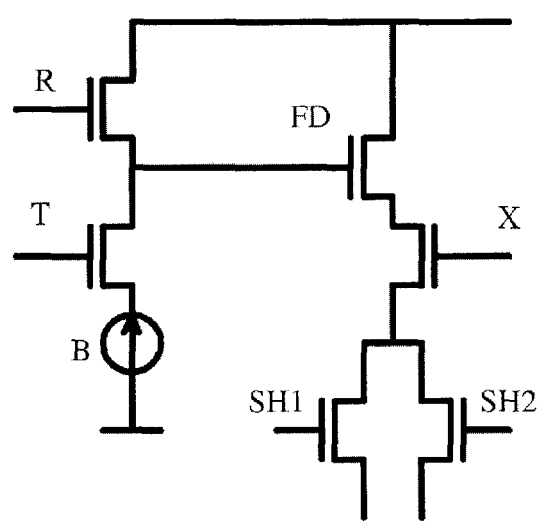
FIG. 4 is a diagram of the circuitry of the pixel unit in the existing CMOS image sensor.
Figure 5:
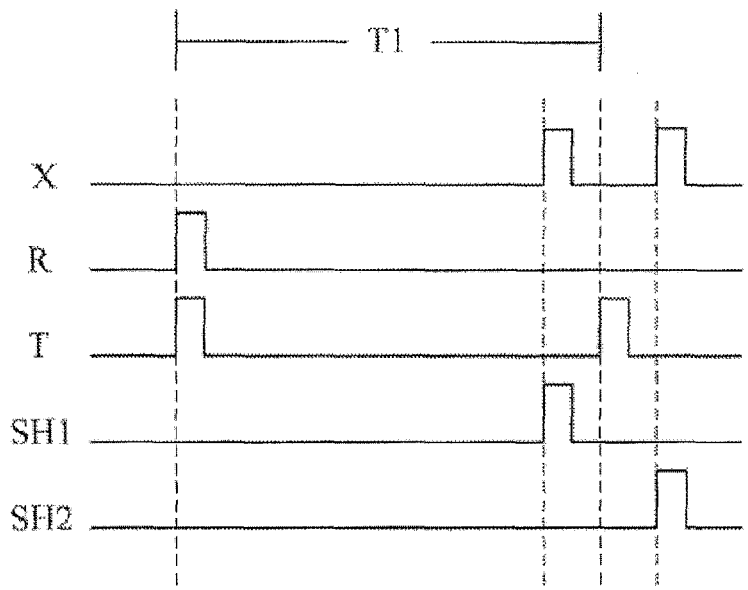
FIG. 5 is a control timing diagram of the pixel unit in the existing CMOS image sensor.
Figure 6:
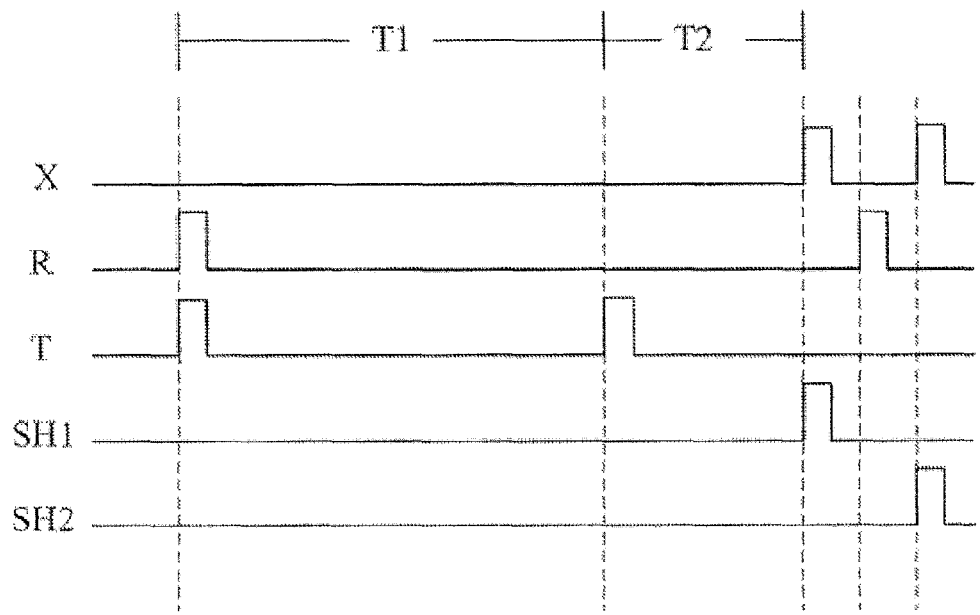
FIG. 6 is a control timing diagram of the pixel unit of the CMOS image sensor according to a preferred embodiment of the present invention.

Reference is now made to FIG. 6, which is a control timing diagram of the pixel unit of the CMOS image sensor according to a preferred embodiment of the present invention. Each pixel unit of the present invention includes a photocell B, a reset transistor R, a charge overflow gate transistor T, a row strobe transistor X, and a source follower FD; the pixel units in each pixel column commonly share a pair of signal outputting transistors, e.g. each of the pixel units is connected to a first signal outputting transistor SH1 and a second signal outputting transistor SH2 of the pixel column including the pixel unit, to output data. The connection relationship of the above elements is the same as that of the circuits in FIG. 5, except that different exposure processes can be implemented by changing the timing of the control signal sent by the control chip in the present invention.

As shown in FIG. 6, the control chip of the present invention transmits, during one exposure period of each pixel row, the following control signals to respectively control the corresponding elements of each pixel unit in the pixel row:

First in step S1, at the beginning of the exposure time T1, high-level pulses are sent out to turn on the reset transistor R and the charge overflow gate transistor T, respectively, so that charges in the source follower FD and the photocell B are emptied. Then the reset transistor R and the charge overflow gate transistor T are turned off, and the exposure of the pixel row starts.

Subsequently, in step S2, at the end of the exposure time T1 of the pixel row, a high-level pulse is sent out to turn on the charge overflow gate transistor T; the charges in the photocell B is transferred to the source follower FD, and then the charge overflow gate transistor T is turned off.

Subsequently, in step S3, at the end of the predetermined waiting time T2 after the end of the exposure time T1 of the pixel row, high-level pulses are sent out to turn on the row strobe transistor X and the first signal outputting transistor SH1 of the pixel column containing the pixel unit, respectively, to sample a signal level. Then the row strobe transistor X and the first signal outputting transistor SH1 of the pixel column containing the pixel unit are turned off.

Subsequently, in step S4, a high-level pulse is sent out to turn on the reset transistor R, to empty the charges in the source follower FD. Then the reset transistor R is turn off.

Subsequently, in step S5, high-level pulses are sent out to turn on the row strobe transistor X and the second signal outputting transistor SH2 of the pixel column containing the pixel unit, respectively, to sample a reference level. A digital signal is obtained from the comparison between the first signal outputting transistor SH1 and the second signal outputting transistor SH2 of the pixel column containing the pixel unit and outputted.

Through the above described timing control manner, each pixel row is controlled to wait for the predetermined waiting time T2 from the exposure time T1 and then start the data output, so that the exposure time of the CMOS image sensor is separated from the time for outputting the data. Therefore, the operating mode of each pixel row in the CMOS image sensor can be more flexibly controlled, in order to facilitate the various manners of exposures of the CMOS image sensor.

In a further embodiment provided by the present invention, the synchronization of the exposure times T1 of at least two pixel rows in the pixel array may be also achieved under the control of the control chip in the CMOS image sensor, and the control chip then controls the at least two pixel rows to respectively wait for different predetermined waiting times T2 after the completion of the exposure and then start the data output. The control process of this embodiment will be specifically described below. In the case that the at least two pixel rows include a pixel row L1 and a pixel row L2, the predetermined waiting time of one of the two pixel rows and that of the other, namely the predetermined waiting time T2-1 and the predetermined waiting time T2-2, are different from each other. The difference between the predetermined waiting time T2-1 and T2-2 is not less than the time required for outputting the data by a single pixel row, so that the data can be output in series. Since the exposure time T1 of the pixel row L1 is synchronized with that of a pixel row L2, the corresponding control process is as follows:

Firstly, the control chip simultaneously send a high-level pulse to turn on the reset transistors R and the charge overflow gate transistors T of all pixel units in the pixel rows L1 and L2, and the exposure will be started after the reset transistors R and the charge overflow gate transistors T are turned off.

Subsequently, at the end of the exposure time T1, the control chip simultaneously sent a high-level pulse to turn on the charge overflow gate transistors T of all pixel units in the pixel rows L1 and L2; the charges in the photocells B are transferred to the source followers FD, and then the charge overflow gate transistors T are turned off.

Subsequently, the control chip sends, respectively at the end of the predetermined waiting time T2-1 and at the end of the predetermined waiting time T2-2 after the completion of the exposure time T1, a control signal to output the data of the pixel rows L1 and L2.

For example, at the end of the predetermined waiting time T2-1 of the pixel row L1 after the completion of the exposure time T1, the control chip respectively sends out a high-level pulse to turn on the row strobe transistors X of all pixel units in the pixel row L1 and to turn on the first signal outputting transistor SH1 of the pixel column containing the pixel units, to sample the signal level. Subsequently, the row strobe transistors X of all pixel units in the pixel row L1 and the first signal outputting transistor SH1 of the pixel column containing the pixel units are turned off. Subsequently, the control chip sends out a high-level pulse to turn on the reset transistors R of all pixel units in the pixel row L1, to empty the charges in the source followers FD. Subsequently, the reset transistors R are turned off. Subsequently, the control chip respectively sends out a high-level pulse to turn on the row strobe transistors X of all pixel units in the pixel row L1 and to turn on the second signal outputting transistor SH2 of the pixel column containing the pixel units, to sample the reference level. The digital signal is obtained from the comparison between the first and second signal outputting transistors SH1 and SH2 respectively corresponding to all pixel units in the pixel row L1 as the data output of the pixel row L1.

Similarly, at the end of the predetermined waiting time T2-2 of the pixel row L2 after the completion of the exposure time T1, the control chip respectively sends out a high-level pulse to turn on the row strobe transistors X of all pixel units in the pixel row L1 and to turn on the first signal outputting transistor SH1 of the pixel column containing the pixel units, to sample the signal level. Subsequently, the row strobe transistors X of all pixel units in the pixel row L2 and the first signal outputting transistor SH1 of the pixel column containing the pixel units are turned off. Subsequently, the control chip sends out a high-level pulse to turn on the reset transistors R of all pixel units in the pixel row L2, to empty the charges in the source followers FD. Subsequently, the reset transistors R are turned off. Subsequently, the control chip respectively send out a high-level pulse to turn on the row strobe transistors X of all pixel units in the pixel row L2 and to turn on the second signal outputting transistor SH2 of the pixel column containing the pixel units, to sample the reference level. The digital signal is obtained from the comparison between the first and second signal outputting transistors SH1 and SH2 respectively corresponding to all pixel units in the pixel row L2 as the data output of the pixel row L2.

Figure 7:
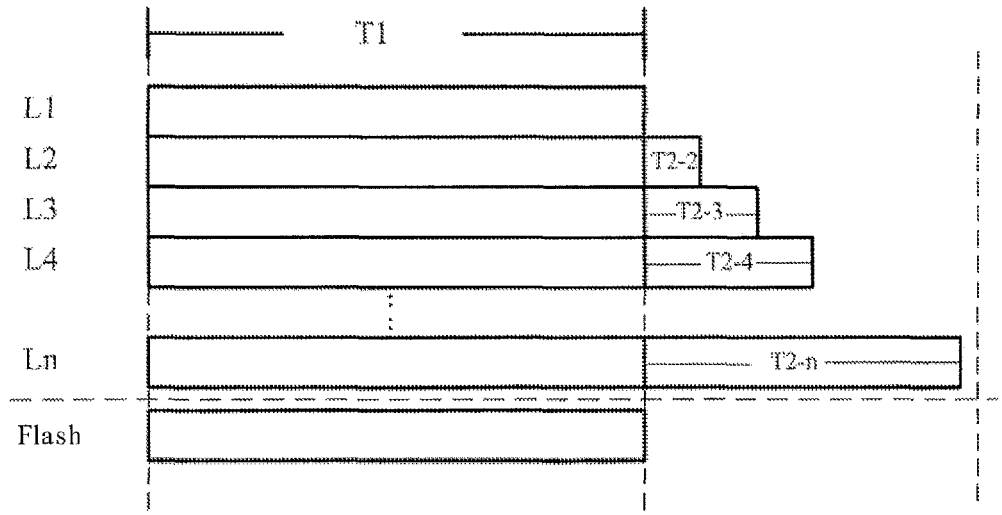
FIG. 7 is a diagram of the operating mode of the CMOS image sensor according to a preferred embodiment of the present invention.

In a further embodiment provided by the present invention, with reference to FIG. 7, the exposure times T1 of all the pixel rows in the CMOS image sensor are synchronized. After the exposure time T1 ends, the control chip controls all the pixel rows to wait for different predetermined waiting times T2 after the completion of the exposure and then start the data output. The predetermined waiting times of all the pixel rows in the pixel array are sequentially incremented, and the increment size is not less than the time for outputting the data by a single pixel row. For example, the pixel row L1 may immediately output the data after the exposure time T1, i.e. the predetermined waiting time T2-1 of the pixel row L1 can be 0; after the exposure time T2, the pixel low L2 starts its data output after waiting for the completion of the data output of the pixel row L1, thus the difference between the predetermined waiting time T2-2 of the pixel row L2 and the predetermined waiting time T2-1 should be not less than the time for outputting the data by the pixel row L1; similarly, the difference between the predetermined waiting time T2-3 of the pixel row L3 and the predetermined waiting time T2-2 should be not less than the time for outputting the data by the pixel row L2; likewise, the difference between the predetermined waiting time T2-n of the pixel row Ln and the predetermined waiting time T2-n-1 of the pixel row Ln-1 is greater than the time for outputting the data by the pixel row Ln-1. Here, the time for outputting the data by a single pixel row in the same image sensor may be equal. If the image sensor provided by the present embodiment is applied in the field of target detection, due to the synchronous exposure of each pixel row, the flash time may be equal to the exposure time, thereby improving the utilization efficiency of the light source energy.

The present invention also correspondingly provides a timing control method of the above CMOS image sensor, which includes a step of performing an exposure during an exposure period of each pixel row and a step of outputting data.

The step of performing an exposure includes: exposing of the pixel row within the exposure time T1 under the control of the control chip. The step of outputting data includes: the pixel row starts outputting data after waiting for the predetermined waiting time T2 from the exposure time T1 under the control of the control chip.

More specifically, the steps of the method are described below. The step exposing includes: sending out by the control chip, the following control signals to respectively control the corresponding elements of each pixel unit in the pixel row:

First, in the step S1, at the beginning of the exposure time T1, high-level pulses are respectively sent out to turn on the reset transistor R and the charge overflow gate transistor T;

Subsequently, in the step S2, at the end of the exposure time T1, a high-level pulse is sent out to turn on the charge overflow gate transistor T.

The step of outputting data includes: sending out by the control chip, the following control signals to respectively control the corresponding elements of each pixel unit in the pixel row:

First, in the step S3, at the end of the predetermined waiting time after the end of the exposure time T1, high-level pulses are respectively sent out to turn on the row strobe transistor X and to turn on the first signal outputting transistor SH1 of the pixel column containing the pixel unit, to sample a signal level.

Subsequently, in the step S4, a high-level pulse is sent out to turn on the reset transistor R.

Subsequently, in the step S5, high-level pulses are respectively sent out to turn on the row strobe transistor X and to turn on the second signal outputting transistor SH2 of the pixel column containing the pixel unit, to sample a reference level.

In connection with the needs of the target detection system, the present invention provides an exposure method based on the CMOS image sensor that is possible to output data after waiting for a while after the above-described exposure, for obtaining a target image by photographing in a first light source state and a second light source state, respectively, and outputting the target images to a first frame buffer and a second frame buffer to detect the target. The first and second light source states may represent the state with light source flash and the state without light source flash that are required for the target detection. Furthermore, it is also possible to provide two different light source states according to the actual needs for the target detection. The above-described CMOS image sensor of the present invention is advantageous in that the exposures of some or all of rows in the CMOS image sensor may be started and ended simultaneously. Therefore, in the exposure method provided by the present invention, the flash of the light source may be conducted simultaneously as the exposure, so that the flash time is equal to the exposure time. In this way, not only the exposure time is fully utilized to enhance the brightness of the target object, but also the light source energy is sufficiently utilized.

In the exposure method provided by the present invention, firstly, the CMOS image sensor is divided into a plurality of sub-arrays which will be subjected to exposure processes in accordance with certain rules, and the plurality of sub-arrays usually contain the same number of pixel rows. Due to the real-time performance of the target detection system, both the target object and background object are not allowed to be displaced excessively in the process of continuously photographing the same scene twice, the time interval between these two photographs should be as small as possible. In the present invention, therefore, the entire array constituted by the pixel units of the CMOS image sensor is divided into sub-arrays as per rows. Due to the reduced number of rows, the time for photographing by the sub-arrays is shorter than that for photographing by the entire pixel array, thus the time interval between two continuous photographing of two image frames is also decreased.

Figure 8:
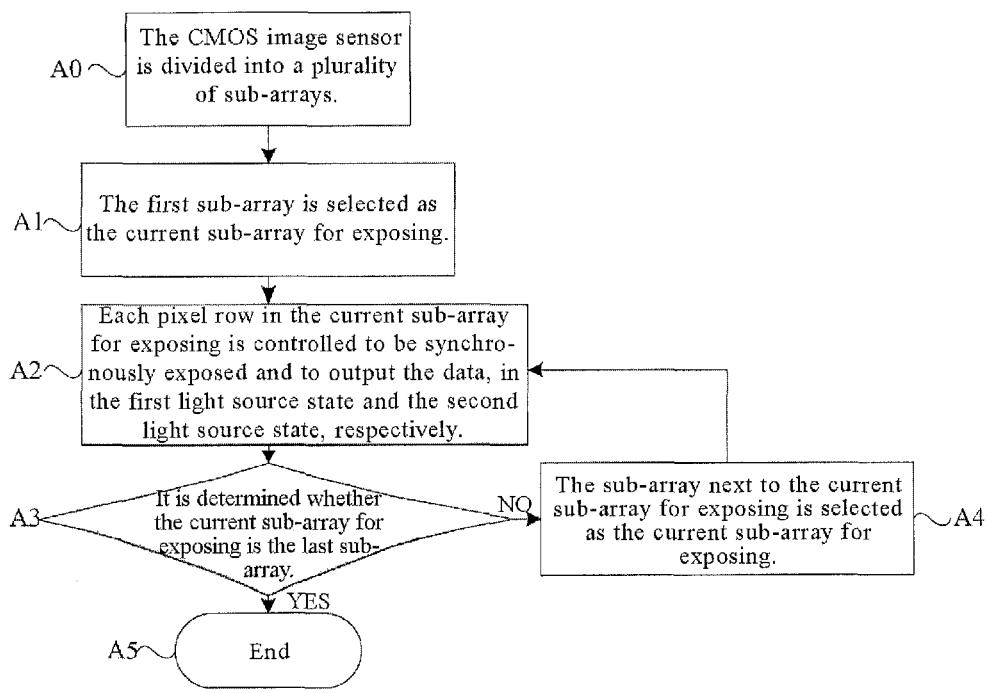
FIG. 8 is a flowchart of the exposure method of the CMOS image sensor according to a first embodiment of the present invention.

Reference is now made to FIG. 8, which is a flowchart of the exposure method of the CMOS image sensor according to the first embodiment of the present invention. As shown in FIG. 8, the exposure method of the present embodiment includes the following steps A0-A5.

First, in step A0, the CMOS image sensor is divided into a plurality of sub-arrays each composed of the same number of pixel rows.

Subsequently, in step A1, the first sub-array is selected as the current sub-array for exposing.

Subsequently, in step A2, each pixel row in the current sub-array for exposing is controlled to be synchronously exposed and to output data, in the first light source state and the second light source state, respectively. Step A2 further includes: step A21 for controlling, in the first light source state, each pixel row in the current sub-array for exposing to undergo the first synchronous exposure, and controlling the pixel row to sequentially output the data to a first frame buffer until the data outputs by all pixel rows in the current sub-array for exposing are completed; and step A22 for controlling, in the second light source state, each pixel row in the current sub-array for exposing to undergo the second synchronous exposure, and controlling the pixel row to sequentially output the data to a second frame buffer until the data outputs by all the pixel rows in the current sub-array for exposing are completed.

Subsequently, in step A3, it is determined whether the current sub-array for exposing is the last sub-array; if so, then step A5 is conducted; otherwise, step A4 is conducted.

Subsequently, in step A4, the sub-array next to the current sub-array for exposing is selected as the current sub-array for exposing, and step A2 is conducted.

Finally, the method ends in step A5.

The exposure process of the first embodiment will be specifically described below in conjunction with the accompanying drawings.

Figure 9:
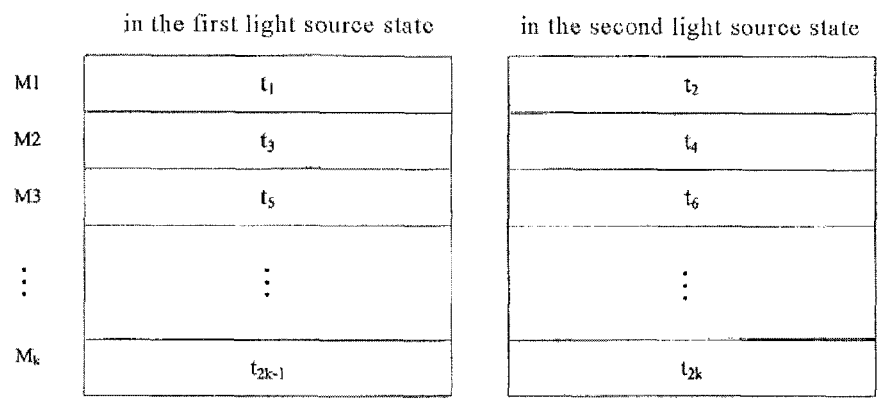
FIG. 9 is a schematic diagram showing the process of the exposure method of the CMOS image sensor according to the first embodiment of the present invention.

Reference is now made to FIG. 9, which is a schematic diagram of the process of the exposure method of the CMOS image sensor according to the first embodiment of the present invention. First, the CMOS image sensor is divided into K sub-arrays, namely sub-arrays M1, M2, M3 . . . Mk. Each sub-array contains the same number of pixel rows. For example, each set of consecutive 16 rows forms one sub-array. In order to obtain target images by photographing in the first light source state and the second light source state, respectively, each time the same sub-array is used for two continuous photographs, one of which is made in the first light source state (i.e. the state with the light source flash) and the other is made in the second light source state (i.e. the state without the light source flash). Then, the next sub-array is used for two continuous photographs, and so on, until the photographs for all sub-arrays in the entire pixel array are completed. For example, during the first time $t_1$, the first sub-array M1 is the current sub-array for exposing and is exposed in the first light source state, and then each row in the current sub-array sequentially outputs data to the first frame buffer; during the second time $t_2$, the first sub-array M1 is still the current sub-array for exposing and is exposed in the second light source state, and then each row of the current sub-array sequentially outputs data to the second frame buffer; if it is determined that the first sub-array M1 is not the last sub-array, the sub-array next to the current sub-array for exposing is selected as the current sub-array for exposing; during the third time $t_3$, the second sub-array M2 is the current sub-array for exposing and is exposed in the first light source state, and then each row in the current sub-array sequentially outputs data to the first frame buffer; during the fourth time the second sub-array M2 is still the current sub-array for exposing and is exposed in the second light source state, and then each row in the current sub-array sequentially outputs data to the second frame buffer; likewise, during the (2k−1)-th time $t_{2k-1}$, the k-th sub-array $M_k$ is the current sub-array for exposing and is exposed in the first light source state, and then each row in the current sub-array sequentially outputs data to the first frame buffer; during the 2k-th time $t_{2k}$, the k-th sub-array $M_k$ is still the current sub-array for exposing and is exposed in the second light source state, and then each row in the current sub-array sequentially outputs data to the second frame buffer; if it is determined that the k-th sub-array $M_k$ is the last sub-array, the entire exposure process is finished.

Figure 10:
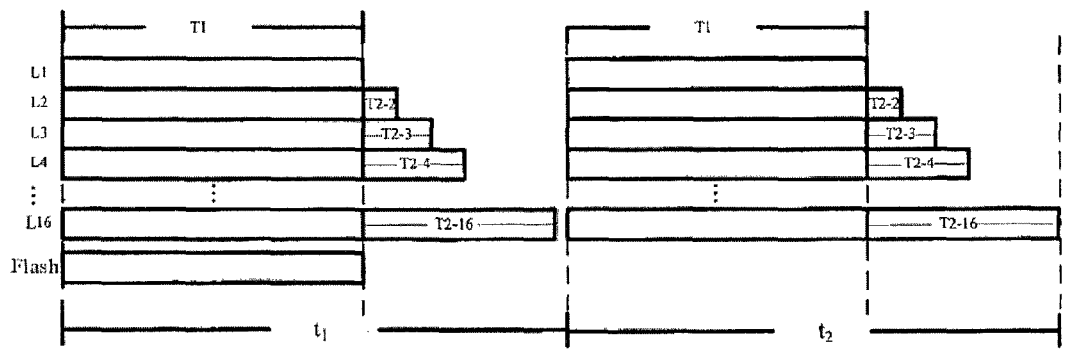
FIG. 10 is a diagram of the operating mode of the first sub-array in the exposure method of the CMOS image sensor according to the first embodiment of the invention.

Reference is now made to FIG. 10, which is a diagram of the operating mode of the first sub-array of the exposure method of the CMOS image sensor according to the first embodiment of the present invention. As shown in FIG. 10, the first sub-array M1 undergoes one synchronous exposure during the first time $t_1$ and during the second time $t_2$, respectively. For example, firstly, pixel rows L1 to L16 of the first sub-array M1 undergoes the first synchronous exposure in the first light source state, with the exposure time being T1. Subsequently, the pixel rows L1 to L16 sequentially output data. This may be implemented by providing different predetermined waiting time for each pixel row, that is, the predetermined waiting time T2−1 of the pixel row L1 may be 0, the difference between the predetermined waiting time T2−2 of the pixel row L2 and the predetermined waiting time T2−1 is not less than the time for outputting the data by the pixel row L1, ..., and so on, thus the predetermined waiting times of pixel rows is continuously incremental, and the difference between the waiting times of the adjacent two pixel rows is not less than the time for outputting the data by a single pixel row. After the data output by the pixel row L16 is complete, the second synchronous exposure is started in the second light source state. In the present invention, the first light source state and the second light source state may be interchangeable, that is, the image may be photographed firstly either in the case with the flash of the light source, or in the case without the flash of the light source, and the order of the first and second light source states does not influence the result of further target detection.

In this way, each unit pixel of the CMOS image sensor undergoes two exposures, one of which is conducted with the light source flash, and the other is conducted without the light source flash. The time difference between the time for acquiring the first image and the time for acquiring the second image is approximately equal to the time for outputting the data by a single sub-array, so that the time interval is effectively reduced, and the real-time performance of image acquisition can be guaranteed. Then, the subtraction of the two results stored in the two buffers is performed by the image processor, and the target area and the background area are distinguished by using a certain threshold value, thereby calculating the characteristics of the target object.

It is noted that, in the exposure method of the CMOS image sensor provided by the first embodiment of the present invention, the sub-arrays are exposed from top to bottom, but can also be exposed from bottom to top.

Figure 11:
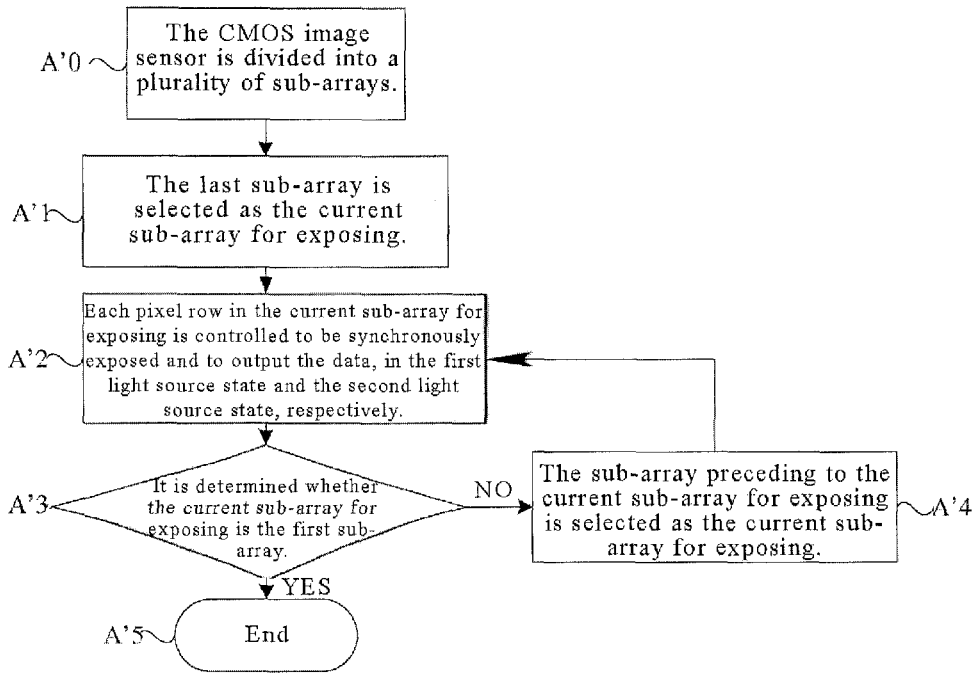
FIG. 11 is a flowchart of the exposure method of the CMOS image sensor according to the second embodiment of the invention.

Reference is now made to FIG. 11, which is a schematic diagram of the process of the exposure method of the CMOS image sensor according to the second embodiment of present invention. First, in step A'0, the CMOS image sensor is divided into a plurality of sub-arrays each composed of the same number of pixel rows.

Subsequently, in step A'1, the last sub-array is selected as the current sub-array for exposing.

Subsequently, in step A'2, each pixel row in the current sub-array for exposing is controlled to be synchronously exposed and to output the data, in the first light source state and the second light source state, respectively. Step A'2 further includes: step A'21 for controlling, in the first light source state, each pixel row in the current sub-array for exposing to undergo a first synchronous exposure, and controlling the pixel row to sequentially output the data to a first frame buffer until the data outputs by all pixel rows in the current sub-array for exposing are completed; and step A'22 for controlling, in the second light source state, each pixel row in the current sub-array for exposing to undergo a second synchronous exposure, and controlling the pixel row to sequentially output the data to a second frame buffer until the data outputs by all pixel rows in the current sub-array for exposing are completed.

Subsequently, in step A'3, it is determined whether the current sub-array for exposing is the first sub-array, if so, then step A'5 is conducted; otherwise, step A'4 is conducted.

Subsequently, in step A'4, the sub-array preceding to the current sub-array for exposing is selected as the current sub-array for exposing, and step A'2 is conducted.

Finally, the method ends in step A'5.

Figure 12:
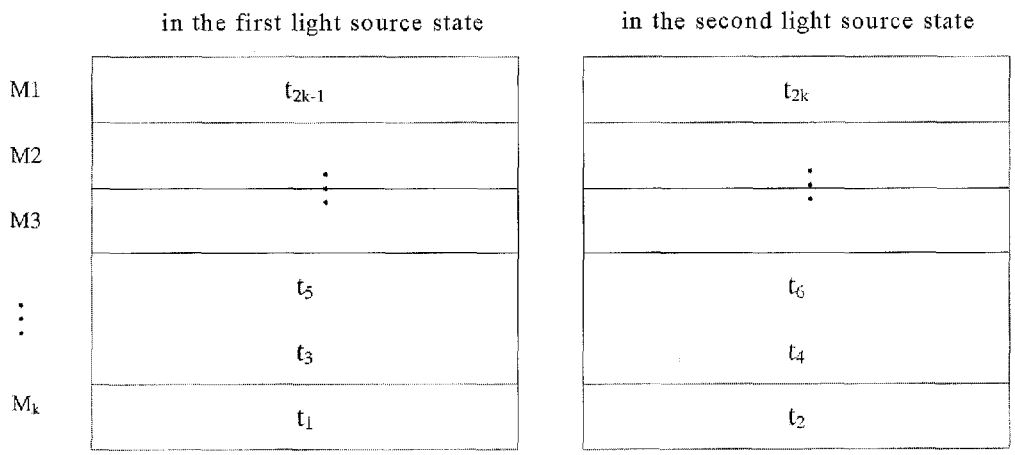
FIG. 12 is a schematic diagram showing the process of the exposure method of the CMOS image sensor according to the second embodiment of the invention.

The specific implementation of the second embodiment is shown in FIG. 12. In the second embodiment, during a first time $t_1$, the k-th sub-array $M_k$ is the current sub-array for exposing and is exposed in the first light source state, and then each row in the current sub-array sequentially outputs data to the first frame buffer, here, the data output may be performed either from top to bottom, or from bottom to top; during a second time $t_2$, the k-th sub-array $M_k$ is still the current sub-array for exposing and is exposed in the second light source state, and then each row in the current sub-array sequentially outputs the data to the second frame buffer; if it is determined that the k-th sub-array Mk is not the first sub-array, the k−1-th sub-array $M_{k-1}$ preceding to the current sub-array for exposing is selected as the current sub-array for exposing; likewise, during the (2k−1)-th time $t_{2k-1}$, the first sub-array M1 is the current sub-array for exposing and is exposed in the first light source state, and then each row sequentially outputs the data to the first frame buffer; during the 2k-th time $t_{2k}$, the first sub-array M1 is still current sub-array for exposing and is exposed in the second light source state, and then each row sequentially outputs data to the second frame buffer; if it is determined that the first sub-array M1 is the first sub-array, the entire exposure process is finished.

Figure 13:
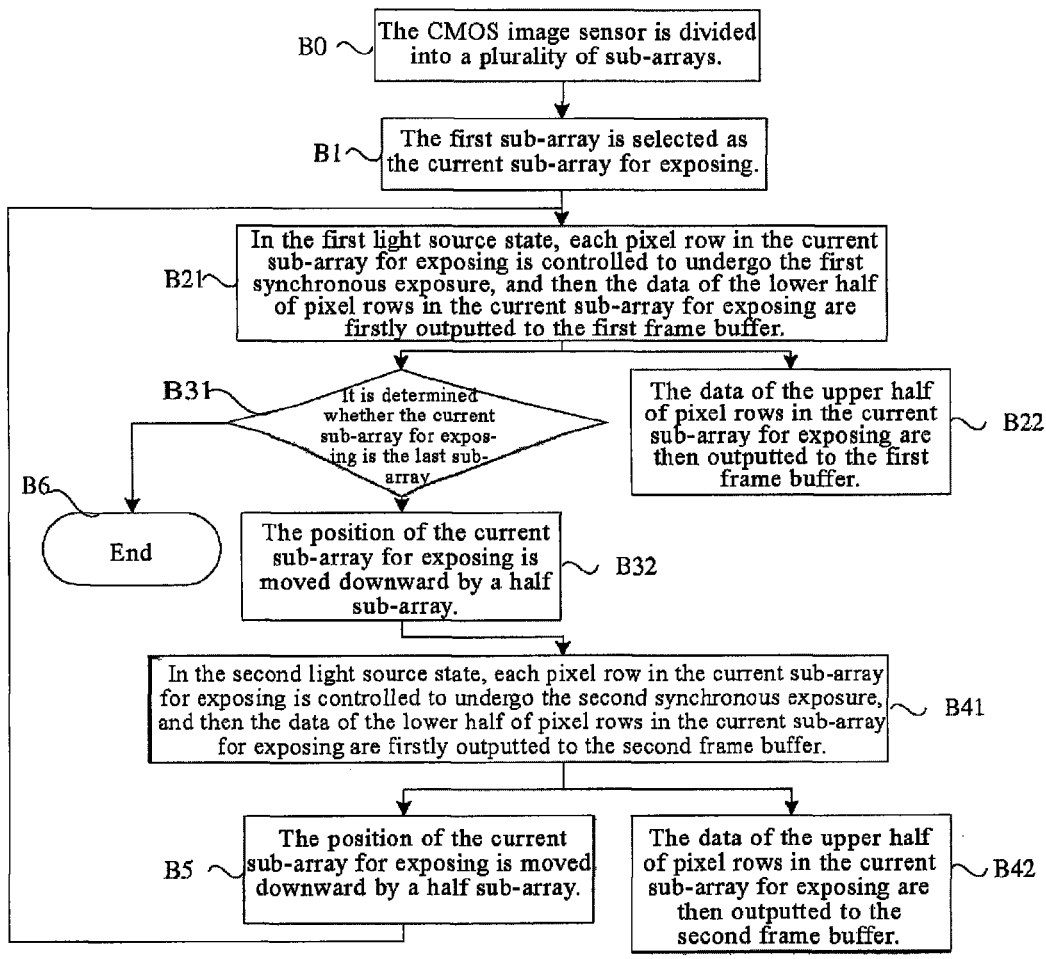
FIG. 13 is a flowchart of the exposure method of the CMOS image sensor according to the third embodiment of the invention.

Reference is now made to FIG. 13, which is a flowchart of the exposure method of the CMOS image sensor according to the third embodiment of the present invention. In this method, the CMOS image sensor is also divided into a plurality of sub-arrays for the exposing. As shown in FIG. 13, the exposure method of the present embodiment includes the following steps B0-B5.

First, in B0 step, the CMOS image sensor is divided into a plurality of sub-arrays each composed of the same number of pixel rows.

Subsequently, in step B1, the first sub-array is selected as the current sub-array for exposing.

Subsequently, step B2 specifically including step B21 and step B22 as shown in FIG. 13 is performed. In step B21, in the first light source state, each pixel row in the current sub-array for exposing is controlled to undergo the first synchronous exposure, and then the data of the lower half of the pixel rows in the current sub-array for exposing are firstly outputted to the first frame buffer. In step B22, the data of the upper half of the pixel rows in the current sub-array for exposing are then outputted to the first frame buffer.

Subsequently, step B3 specifically including step B31 and step B32 in FIG. 13 is performed. In step B31, when the data outputs by the lower half of the pixel rows in the current sub-array for exposing are completed, and it is determined whether the current sub-array for exposing is the last sub-array, if so, then step B6 is conducted, otherwise, step B32 is conducted. In step B32, the position of the current sub-array for exposing is moved downward by a half sub-array;

Subsequently, step B4 specifically including step B41 and step B42 in FIG. 13 is performed. In step B41, in the second light source state, each pixel row in the current sub-array for exposing is controlled to undergo the second synchronous exposure, and then the data of the lower half of the pixel rows in the current sub-array for exposing are firstly outputted to the second frame buffer. In the step B42, the data of the upper half of the pixel rows in the current sub-array for exposing are then outputted to the second frame buffer.

Subsequently, in step B5, when the data outputs by the lower half of the pixel rows in the current sub-array for exposing are completed, the position of the current sub-array for exposing is moved downward by a half sub-array, and step B2 is conducted.

It is noted that in the above process, step B22 and step B31 are performed in parallel after step B21, that is, the lower half of the pixel rows, which has finished outputting the data, undergoes the next exposure at the same time when the data of the upper half of the pixel rows are outputted, so as to reduce the time difference between the two exposures. Similarly, step B42 and step B5 are performed in parallel after step B41.

In a further embodiment of the present invention, after the first synchronous exposure in step B2, the data of each pixel row in the current sub-array for exposing is sequentially outputted to the first frame buffer in accordance with the order from bottom to top. In step B4, after the second synchronous exposure, the data of each pixel row in the current sub-array for exposing is sequentially outputted to the second frame buffer in accordance with the order from bottom to top.

Figure 14:
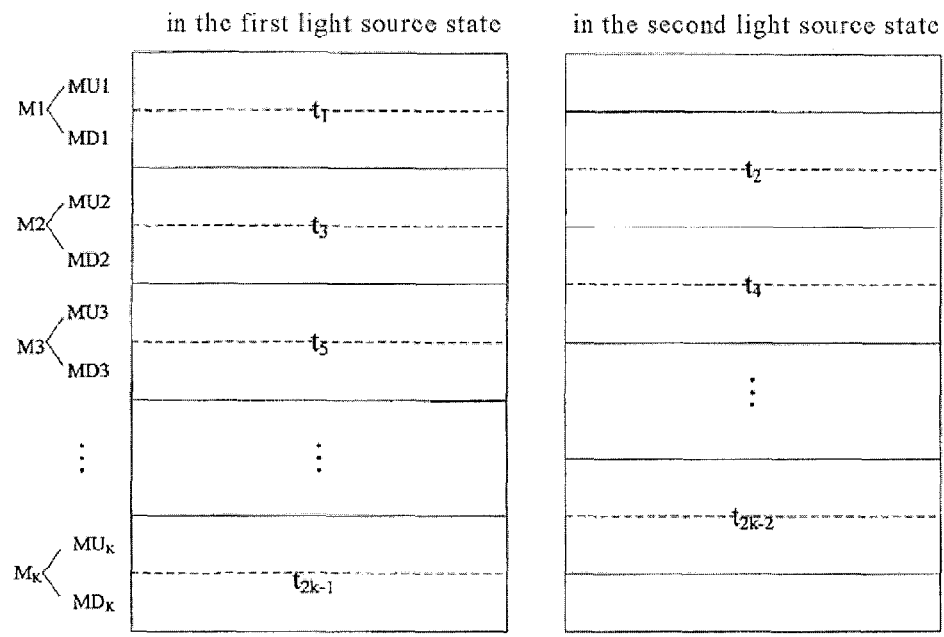
FIG. 14 is a schematic diagram showing the process of the exposure method of the CMOS image sensor according to the third embodiment of the invention.

Reference is now made to FIG. 14, which is a schematic diagram of the process of the exposure method of the CMOS image sensor according to the third embodiment of the present invention. First, the CMOS image sensor is divided into K sub-arrays, namely sub-arrays M1, M2, M3 . . . Mk. During the first time $t_1$, the first sub-array M1 is the current sub-array for exposing and is exposed in the first light source state, and then each row in the current sub-array sequentially outputs data to the first frame buffer from bottom to top, that is, the data outputs by the lower half of the pixel rows MD1 are completed firstly, and after that the data outputs by the upper half of the pixel rows MU1 are completed; during the second time $t_2$, when the data outputs by the lower half of the pixel rows MD1 of the first sub-array M1 are completed, and it is determined that the first sub-array M1 is not the last sub-array, the position of the current sub-array for exposing is moved downward by a half sub-array, which means that the lower half of pixel rows MD1 of the first sub-array M1 and the upper half of pixel rows MU2 of the second sub-array M2 form a new current sub-array for exposing, so that in the second light source state, each pixel row in the new current sub-array for exposing is controlled to undergo the second synchronous exposure, . . . , likewise, during the (2k−1)-th time $t_{2k-1}$, the k-th sub-array $M_k$ is the current sub-array for exposing and is exposed in the first light source state, and then each row in the current sub-array sequentially outputs data to the first frame buffer from bottom to top; if it is determined that the k-th sub-array Mk is the last sub-array, the entire exposure process is finished.

The following description is made by an example in which every 32 pixel rows form one sub-array. In every time, one sub-array is used per photograph, and the output sequence is such that the output is made sequentially from the 32th pixel row to the 1st pixel row. The sub-array is then moved downward by 16 pixel rows to form a new sub-array, which is used for photographing once again. Such process is repeated, until the photographs by the entire pixel array are finished. In the case of an odd photograph, the light source is in a first lighting state, i.e. a state with the light source flash; and in the case of an even photograph, the light source is in a second lighting state, i.e. a state without light source flash. More specifically, the first photograph is taken for a sub-array formed by the 1st to 32th pixel rows, with the light from the light source; the second photograph is taken for a sub-array formed by the 17th to 48th pixel rows, without the light from the light source; the third photograph is taken for a sub-array formed by the 33th to 64th pixel rows, with the light from the light source, and so on, until the photographs by the entire CMOS sensor are finished. At this point, except the upper half of pixel rows (i.e. 16 pixel rows in total) of the first sub-array and the lower half of pixel rows (i.e. 16 pixel rows in total) of the last sub-array, each pixel unit in the CMOS image sensor undergoes two exposures, one of which is made with the light from the light source, and the other is made without the light from the light source. Then, the subtraction of the two results with respect to the two exposures is performed by the control chip of the CMOS image processor, and the target area and the background area are distinguished using a certain threshold value, thereby further calculating the characteristics of the target object.

Figure 15:
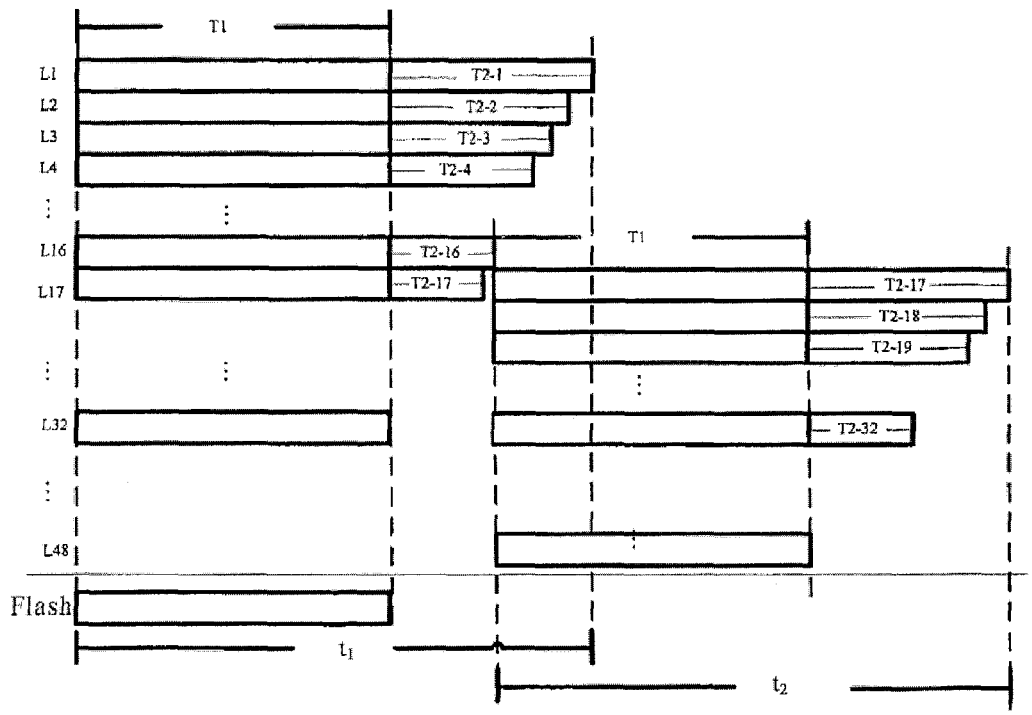
FIG. 15 is a diagram of the operating mode of the exposure method of the CMOS image sensor according to the third embodiment of the invention.

Reference is now made to FIG. 15, which is a diagram of the operating mode of the first sub-array in the third embodiment of the exposure method of the CMOS image sensor according to the present invention. As shown in FIG. 15, firstly, pixel rows L1 to L32 of the first sub-array M1 undergoes the first synchronous exposure in the first light source state during a first time $t_1$, thus the exposure time is T1. Subsequently, the pixel rows L32 to L1 sequentially output the data. This may be implemented by providing different predetermined waiting time for each pixel row, that is, the predetermined waiting time T2−32 of the pixel row L32 may be 0, the difference between the predetermined waiting time T2−31 of the pixel row L31 and the predetermined waiting time T2−32 is greater than the time for outputting the data by the pixel row L32, . . . , and so on, the predetermined waiting time of pixel rows from bottom to top is continuously incremental, and the time difference between the waiting times of the adjacent pixel rows is greater than the time for outputting the data by the preceding pixel row. After the data output by the pixel row L17 is completed, the second synchronous exposure for the pixel rows L17 to L48 is started in the second light source state. The above process is repeated. Although in this method the first 16 pixel rows and the last 16 pixel rows of the CMOS image sensor cannot be utilized, but when the data outputs by the first 16 pixel rows in a sub-array having 32 pixel rows are completed, the exposure for the next sub-array can be started immediately, resulting in that the exposure time of the next sub-array is overlapped with the time for the data output of the last 16 pixel rows in the preceding sub-array, therefore, the time expenditure can be saved, and the frame rate of the entire system can be improved, which is very helpful to construct the real-time target detection system.

Similarly, in the exposure method of the CMOS image sensor provided by the third embodiment of the present invention, the sub-arrays are exposed from top to bottom, but can also be exposed from bottom to up, as an alternative.

Figure 16:
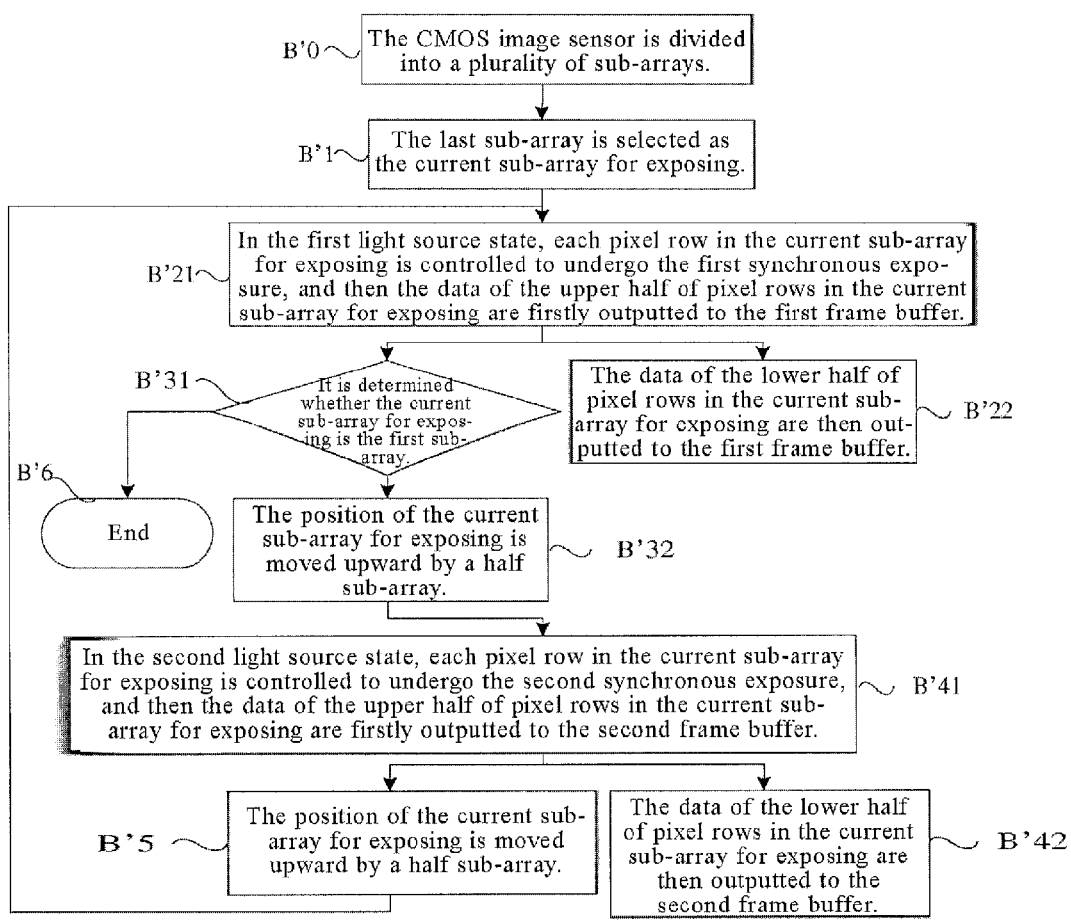
FIG. 16 is a flowchart of the exposure method of the CMOS image sensor according to the fourth embodiment of the invention.

Reference is now made to FIG. 16, which is a schematic diagram of the process of the exposure method of the CMOS image sensor according to the fourth embodiment of the present invention. First, in B'0 step, the CMOS image sensor is divided into a plurality of sub-arrays each composed of the same number of pixel rows.

Subsequently, in step B'1, the last sub-array is selected as the current sub-array for exposing.

Subsequently, step B'2 specifically including step B'21 and step B'22 is performed. In step B'21, in the first light source state, each pixel row in the current sub-array for exposing is controlled to undergo the first synchronous exposure, and then the data of the upper half of pixel rows in the current sub-array for exposing are firstly outputted to the first frame buffer. In step B'22, the data of the lower half of pixel rows in the current sub-array for exposing are then outputted to the first frame buffer.

Subsequently, step B'3 specifically including step B'31 and step B'32 is performed. In step B'31, when the data outputs by the upper half of pixel rows in the current sub-array for exposing are completed, and it is determined whether the current sub-array for exposing is the first sub-array, if so, then step B'6 is conducted, otherwise, step B'32 is conducted. In step B'32, the position of the current sub-array for exposing is moved upward by a half sub-array;

Subsequently, step B'4 specifically including step B'41 and step B'42 is performed. In step B'41, in the second light source state, each pixel row in the current sub-array for exposing is controlled to undergo the second synchronous exposure, and then the data of the upper half of pixel rows in the current sub-array for exposing are firstly outputted to the second frame buffer. In step B'42, the data of the lower half of pixel rows in the current sub-array for exposing are then outputted to the second frame buffer.

Subsequently, in step B'5, when the data outputs by the upper half of pixel rows in the current sub-array for exposing are complete, the position of the current sub-array for exposing is moved upward by a half sub-array, and step B'2 is conducted.

It is noted that in the above process, step B'22 and step B'31 are likewise performed in parallel after step B'21, that is, the upper half of pixel rows, which has finished the data output, undergoes the next exposure at the same time when the data of the lower half of pixel rows are outputted, so as to reduce the time difference between the two exposures. Similarly, step B'42 and step B'5 are performed in parallel after step B'41.

In a further embodiment of the present invention, in step B'2, after the first synchronous exposure, the data of all pixel rows in the current sub-array for exposing are sequentially outputted to the first frame buffer in accordance with an order from top to bottom. In step B4, after the second synchronous exposure, the data of all pixel rows in the current sub-array for exposing are sequentially outputted to the second frame buffer in accordance with an order from bottom to top.

Figure 17:
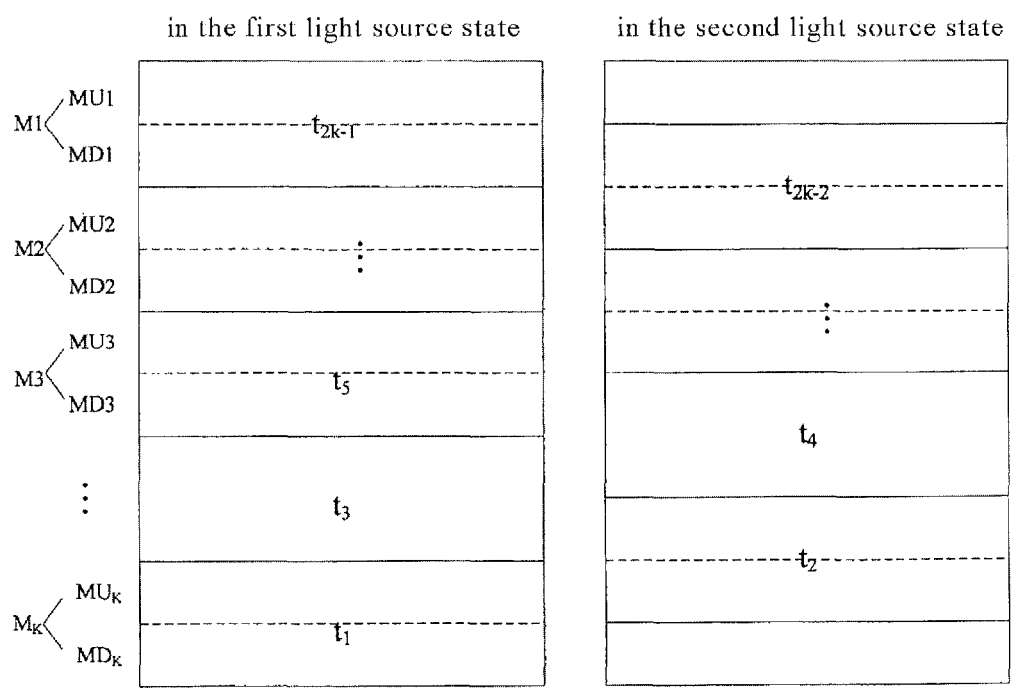
FIG. 17 is a schematic diagram of the process of the exposure method of the CMOS image sensor according to the fourth embodiment of the invention.

The specific implementation of the fourth embodiment is as shown in FIG. 17. First, the CMOS image sensor is divided into K sub-arrays, namely sub-arrays M1, M2, M3 . . . Mk. During the first time $t_1$, the k-th sub-array $M_k$ is the current sub-array for exposing and is exposed in the first light source state, and then all pixel rows in the current sub-array sequentially output the data to the first frame buffer from top to bottom, that is, the data outputs by the upper half of pixel rows $MU_k$ are completed firstly, and after that the data outputs by the lower half of pixel rows $MD_k$ are completed; during the second time $t_2$, when the data outputs by the upper half of pixel rows $MU_k$ of the k-th sub-array $M_k$ are completed, if it is determined that the k-th sub-array $M_k$ is not the first sub-array, the position of the current sub-array for exposing is moved upward by a half sub-array, which means that the upper half of pixel rows $MU_k$ of the k-th sub-array $M_k$ and the lower half of pixel rows $MD_{k-1}$ of the (k−1)-th sub-array $M_{k-1}$ form a new current sub-array for exposing, thus in the second light source state, each pixel row in the new current sub-array for exposing is controlled to undergoes the second synchronous exposure, . . . , likewise during the 2k−1-th time $t_{2k-1}$, the first sub-array M1 is the current sub-array for exposing and is exposed in the first light source state, and then each row sequentially outputs data to the first frame buffer from bottom to top; if it is determined that the first sub-array M1 is the first sub-array, thus the entire exposure process is finished.

The present invention is described according to the specific embodiments, however, those skilled in the art should be understood that various changes and equivalent varies may be made without departing from the scope of the present invention. Furthermore, in order to adapt the particular situation or material of the present invention, several modifications may be made for the invention without departing from the scope of the protection thereof. Accordingly, the present invention is not limited to the particular embodiment disclosed herein, but covers all embodiments which fall into the scope of the claims.

The invention claimed is:

1. An exposure method of a CMOS image sensor, for obtaining a target image by photographing in a first light source state and a second light source state, respectively, and outputting the target images to a first frame buffer and a second frame buffer to detect a target, wherein, the exposure method comprises steps of:

B0: dividing the CMOS image sensor into a plurality of sub-arrays, each of which is composed of the same number of pixels rows;

B1: selecting the first sub-array as the current sub-array for exposing;

B2: in the first light source state, controlling each pixel row in the current sub-array for exposing to undergo the first synchronous exposure, then outputting data of a lower half of pixel rows in the current sub-array for exposing to a first frame buffer, and then outputting data of an upper half of pixel rows in the current sub-array for exposing to the first frame buffer;

B3: when the data outputs by the lower half of pixel rows in the current sub-array for exposing are completed, determining whether the current sub-array for exposing is the last sub-array, and if so, the method is finished; otherwise, the position of the current sub-array for exposing is moved down by a half sub-array;

B4: in the second light source state, controlling each pixel row in the current sub-array for exposing to undergo the second synchronous exposure, then outputting data of the lower half of pixel rows in the current sub-array for exposing to a second frame buffer, and then outputting the data of the upper half of pixel rows in the current sub-array for exposing to the second frame buffer; and B5: when the data outputs by the lower half of pixel rows in the current sub-array for exposing are completed, moving down the position of the current sub-array for exposing by a half sub-array, and step B2 is conducted;

wherein the CMOS image sensor comprises:
a pixel array composed of a plurality of pixel rows, and
a control chip for controlling the pixel array;

wherein, each of the pixel rows is exposed within an exposure time (T1) under the control of the control chip during one exposure period of the pixel row, and then the pixel row outputs data after waiting for a predetermined waiting time (T2) from the exposure time (T1) under the control of the control chip.

2. The exposure method of claim 1, wherein
the step B2 includes that after the first synchronous exposure, the data of each pixel row in the current sub-array for exposing is sequentially outputted to the first frame buffer from bottom to up of the current sub-array; and
the step B4 includes that after the second synchronous exposure, the data of each pixel row in the current sub-array for exposing is sequentially outputted to the second frame buffer from bottom to up of the current sub-array.

3. An exposure method of a CMOS image sensor, for obtaining a target image by photographing in a first light source state and a second light source state, respectively, and outputting the target images to a first frame buffer and a second frame buffer to detect a target, wherein, the exposure method comprises steps of:
B'0: dividing the CMOS image sensor into a plurality of sub-arrays, each of which is composed of the same number of pixel rows;
B'1: selecting the last sub-array as the current sub-array for exposing;
B'2: in the first light source state, controlling each pixel row in the current sub-array for exposing to undergo the first synchronous exposure, and then outputting data of an upper half of pixel rows in the current sub-array for exposing to a first frame buffer, and then outputting data of a lower half of pixel rows in the current sub-array for exposing to the first frame buffer;
B'3: when the data outputs by the upper half of pixel rows in the current sub-array for exposing are completed, determining whether the current sub-array for exposing is the first sub-array, and if so, then the method is finished; otherwise, the position of the current sub-array for exposing is moved up by a half sub-array;
B'4: in the second light source state, controlling each pixel row in the current sub-array for exposing to undergo the second synchronous exposure, and then outputting the data of the upper half of pixel rows in the current sub-array for exposing to a second frame buffer, and the outputting the data of the lower half of pixel rows in the current sub-array for exposing to the second frame buffer; and
B'5: when the data outputs by the upper half of pixel rows in the current sub-array for exposing are completed, moving upward the position of the current sub-array for exposing by a half sub-array, and step B'2 is conducted;
wherein, the CMOS image sensor comprises:
a pixel array composed of a plurality of pixel rows, and
a control chip for controlling the pixel array;
wherein, each of the pixel rows is exposed within an exposure time (T1) under the control of the control chip during one exposure period of the pixel row, and then the pixel row outputs data after waiting for a predetermined waiting time (T2) from the exposure time (T1) under the control of the control chip.

4. The exposure method of claim 3, wherein
the step B'2 includes that after the first synchronous exposure, the data of each pixel row in the current sub-array for exposing is sequentially outputted to the first frame buffer from top to bottom of the current sub-array; and
the step B'4 includes that after the second synchronous exposure, the data of each pixel row in the current sub-array for exposing is sequentially outputted to the second frame buffer from top to bottom of the current sub-array.

5. The exposure method of claim 3, wherein, the control chip further controls the exposure times (T1) of at least two pixel rows in the pixel array to be synchronized, the control chip then controls the at least two pixel rows to output the data after respectively waiting for different predetermined waiting times (T2) from the completion of the exposure, and the difference between the predetermined waiting times (T2) of the at least two pixel rows is not less than the time required for outputting the data by a single pixel row.

6. The exposure method of claim 5, wherein the control chip further controls the exposure times (T1) of all pixel rows in the pixel array to be synchronized, the control chip then controls all the pixel rows to output the data after respectively waiting for different predetermined waiting times (T2) from the completion of the exposure, and the predetermined waiting times of all the pixel rows in the pixel array are incremental sequentially, and the incremental size is not less than the time required for outputting the data by a single pixel row.

* * * * *